US009105559B2

(12) United States Patent
Basker et al.

(10) Patent No.: US 9,105,559 B2
(45) Date of Patent: Aug. 11, 2015

(54) CONFORMAL DOPING FOR FINFET DEVICES

(71) Applicants: International Business Machines Corporation, Armonk, NY (US); GLOBALFOUNDRIES Inc., Grand Cayman (KY)

(72) Inventors: Veeraraghavan S. Basker, Schenectady, NY (US); Nathaniel Berliner, Bend, OR (US); Hyun-Jin Cho, Palo Alto, CA (US); Johnathan Faltermeier, Delanson, NY (US); Kam-Leung Lee, Putnam Valley, NY (US); Tenko Yamashita, Schenectady, NY (US)

(73) Assignees: International Business Machines Corporation, Armonk, NY (US); Global Foundries, Inc., Grand Cayman (KY)

( * ) Notice: Subject to any disclaimer, the term of this patent is extended or adjusted under 35 U.S.C. 154(b) by 0 days.

(21) Appl. No.: 14/028,517

(22) Filed: Sep. 16, 2013

(65) Prior Publication Data

US 2015/0079773 A1   Mar. 19, 2015

(51) Int. Cl.
*H01L 21/00* (2006.01)
*H01L 21/18* (2006.01)
*H01L 21/225* (2006.01)

(52) U.S. Cl.
CPC .......... *H01L 21/18* (2013.01); *H01L 21/2251* (2013.01)

(58) Field of Classification Search
None
See application file for complete search history.

(56) References Cited

U.S. PATENT DOCUMENTS

| | | | |
|---|---|---|---|
| 6,190,979 B1 * | 2/2001 | Radens et al. | 438/301 |
| 6,333,245 B1 * | 12/2001 | Furukawa et al. | 438/542 |
| 6,436,783 B1 * | 8/2002 | Ono et al. | 438/366 |
| 6,489,207 B2 * | 12/2002 | Furukawa et al. | 438/301 |
| 7,183,613 B1 | 2/2007 | Zhu et al. | |
| 7,943,454 B2 | 5/2011 | Chen et al. | |
| 8,071,451 B2 * | 12/2011 | Berry | 438/276 |
| 8,114,761 B2 * | 2/2012 | Mandrekar et al. | 438/563 |
| 8,394,710 B2 * | 3/2013 | Cheng et al. | 438/558 |

(Continued)

OTHER PUBLICATIONS

H. S. Yang et al., "Dual stress liner for high performance sub-45nm gate length SOI CMOS manufacturing," IEEE International Electron Devices Meeting, 2004. IEDM Technical Digest. Dec. 13-15, 2004, pp. 1075-1077.

(Continued)

*Primary Examiner* — Charles Garber
*Assistant Examiner* — Evren Seven
(74) *Attorney, Agent, or Firm* — Law Offices of Ira D. Blecker, P.C.

(57) ABSTRACT

A conformal doping process for FinFET devices on a semiconductor substrate which includes NFET fins and PFET fins. In a first exemplary embodiment, an N-type dopant composition is conformally deposited over the NFET fins and the PFET fins. The semiconductor substrate is annealed to drive in an N-type dopant from the N-type dopant composition into the NFET fins. A P-type dopant composition is conformally deposited over the NFET fins and the PFET fins. The semiconductor substrate is annealed to drive in a P-type dopant from the P-type dopant composition into the PFET fins. In a second exemplary embodiment, one of the NFET fins and PFET fins may be covered with a first dopant composition and then a second dopant composition may cover both the NFET fins and the PFET fins followed by an anneal to drive in both dopants.

6 Claims, 14 Drawing Sheets

(56) References Cited

U.S. PATENT DOCUMENTS

| | | | |
|---|---|---|---|
| 8,569,158 B2* | 10/2013 | Clark | 438/559 |
| 8,580,664 B2* | 11/2013 | Clark | 438/558 |
| 8,703,593 B2* | 4/2014 | Tsai et al. | 438/558 |
| 2006/0228848 A1 | 10/2006 | Chan et al. | |
| 2007/0108525 A1 | 5/2007 | Yang et al. | |
| 2008/0054413 A1 | 3/2008 | Dyer et al. | |
| 2009/0017630 A1 | 1/2009 | Lee et al. | |
| 2009/0035909 A1 | 2/2009 | Chang et al. | |
| 2009/0065867 A1 | 3/2009 | Yin et al. | |
| 2009/0121295 A1 | 5/2009 | Greene et al. | |
| 2011/0021010 A1 | 1/2011 | Cheng et al. | |
| 2011/0171795 A1* | 7/2011 | Tsai et al. | 438/232 |
| 2011/0195555 A1* | 8/2011 | Tsai et al. | 438/301 |
| 2011/0269287 A1* | 11/2011 | Tsai et al. | 438/306 |
| 2011/0309333 A1* | 12/2011 | Cheng et al. | 257/24 |
| 2012/0252197 A1* | 10/2012 | Clark | 438/559 |
| 2013/0040447 A1* | 2/2013 | Swaminathan et al. | 438/558 |
| 2013/0187129 A1* | 7/2013 | Cheng et al. | 257/24 |
| 2013/0280883 A1* | 10/2013 | Faul et al. | 438/434 |
| 2013/0285144 A1* | 10/2013 | Lim et al. | 257/365 |
| 2014/0004689 A1* | 1/2014 | Nainani et al. | 438/559 |
| 2014/0008727 A1* | 1/2014 | Loo et al. | 257/347 |
| 2014/0159120 A1* | 6/2014 | Ahmed | 257/213 |

OTHER PUBLICATIONS

E. Leobandung et al., "High performance 65 nm SOI technology with dual stress liner and low capacitance SRAM cell," Symposium on VLSI Technology, 2005. Digest of Technical Papers, Jun. 14-16, 2005, pp. 126-127.

Prosecution history of related PCT application, PCT/CN2014/086615, International Search Report and Written Opinion, mailed Dec. 2, 2014, all pages.

* cited by examiner

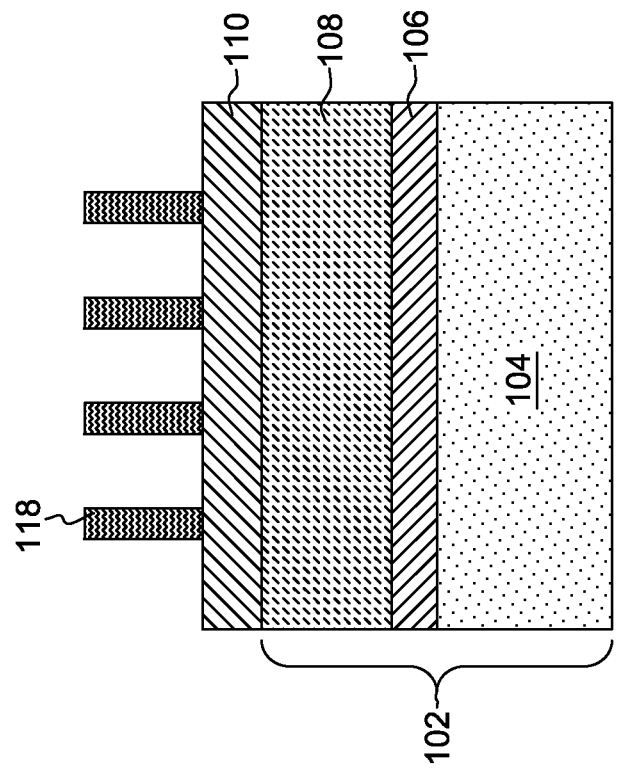
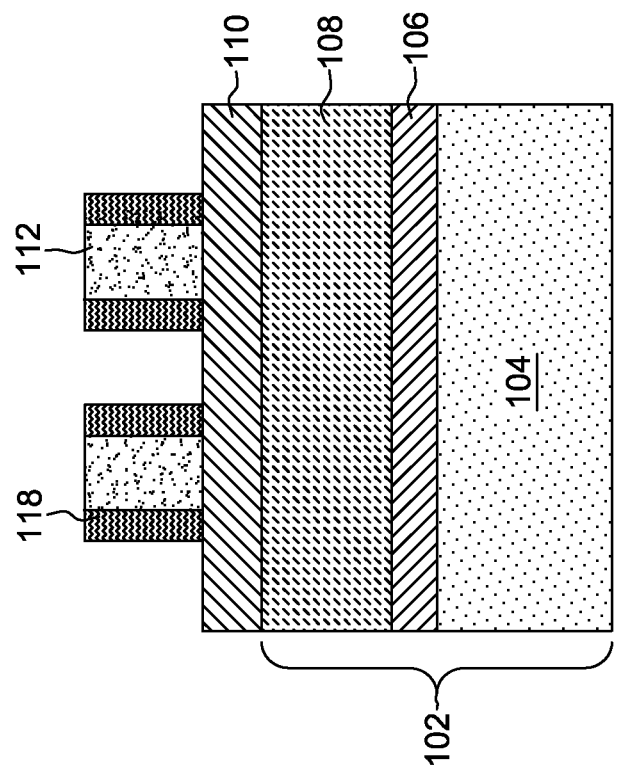

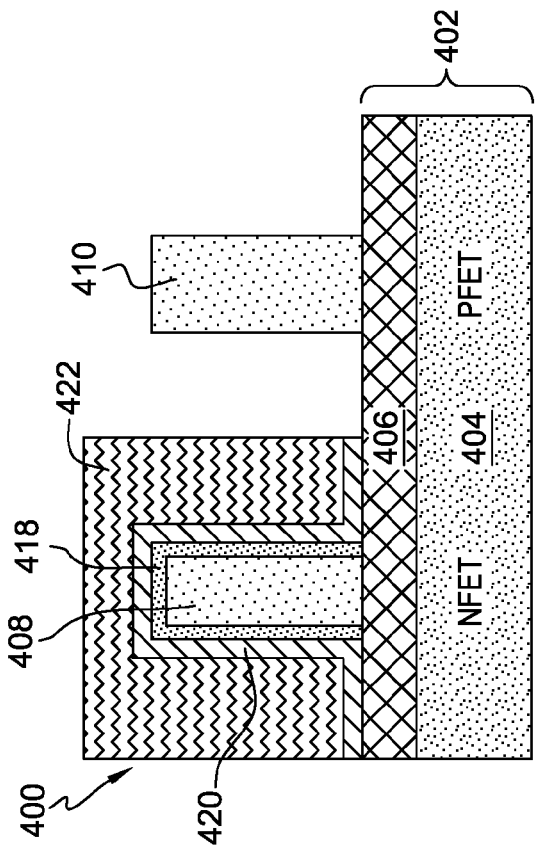
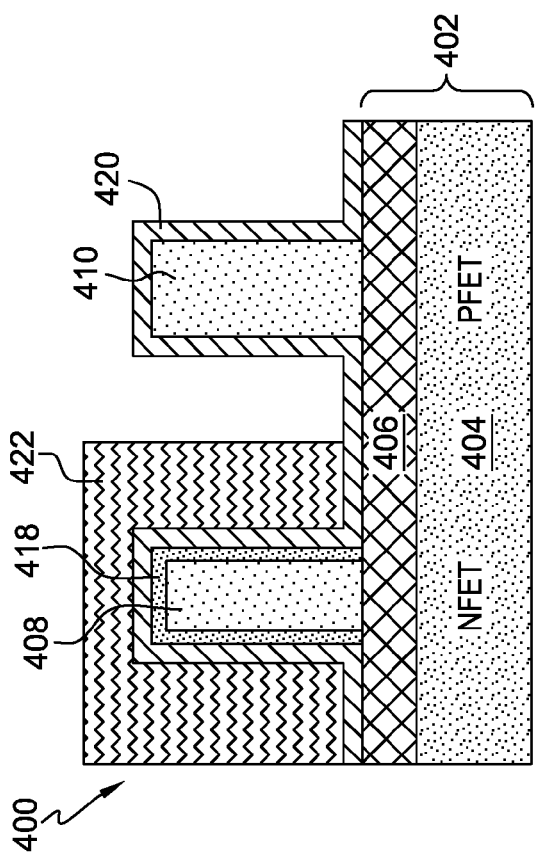

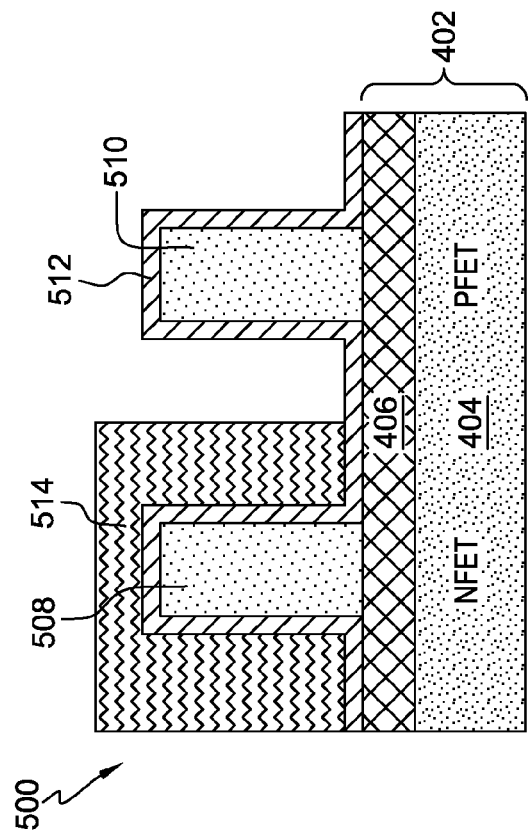
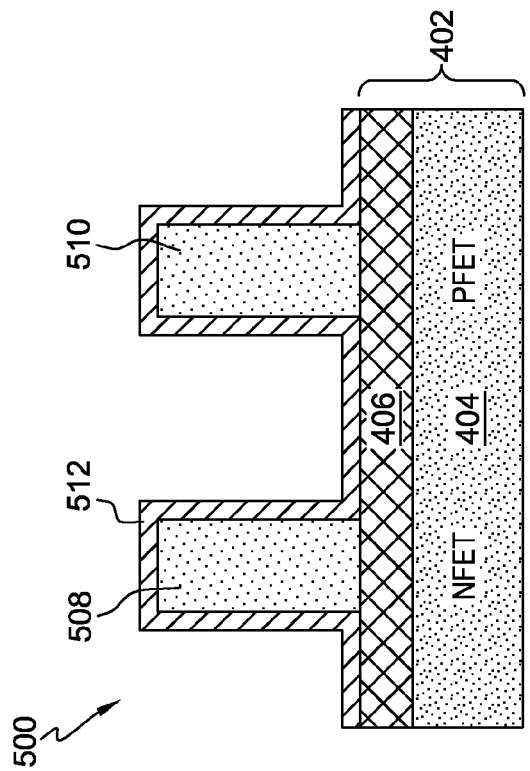

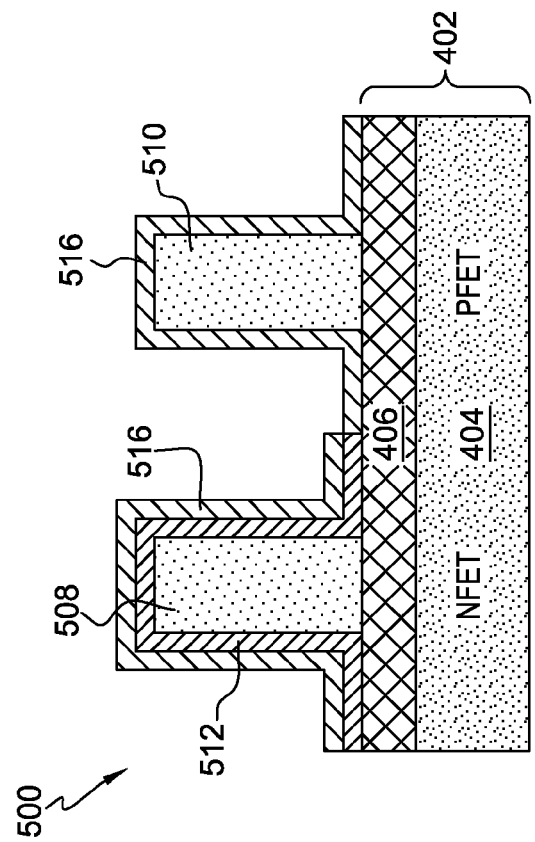
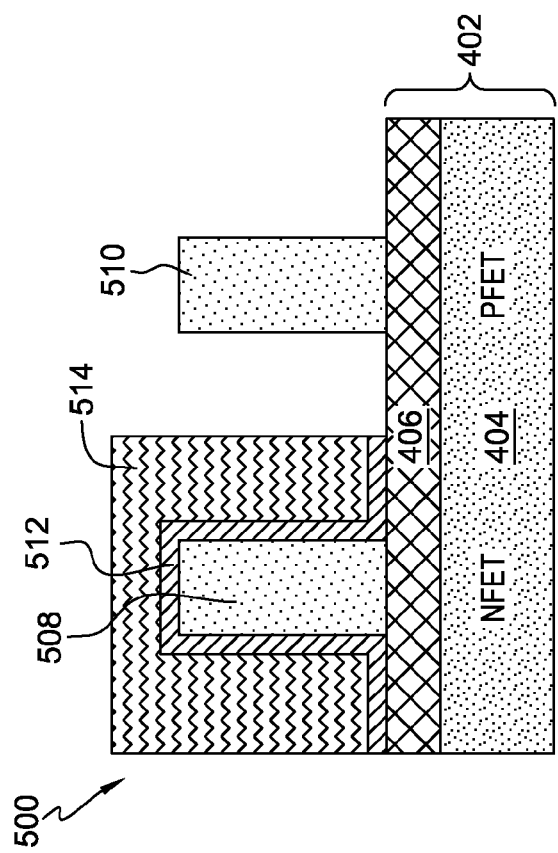
FIG. 5D
FIG. 5C

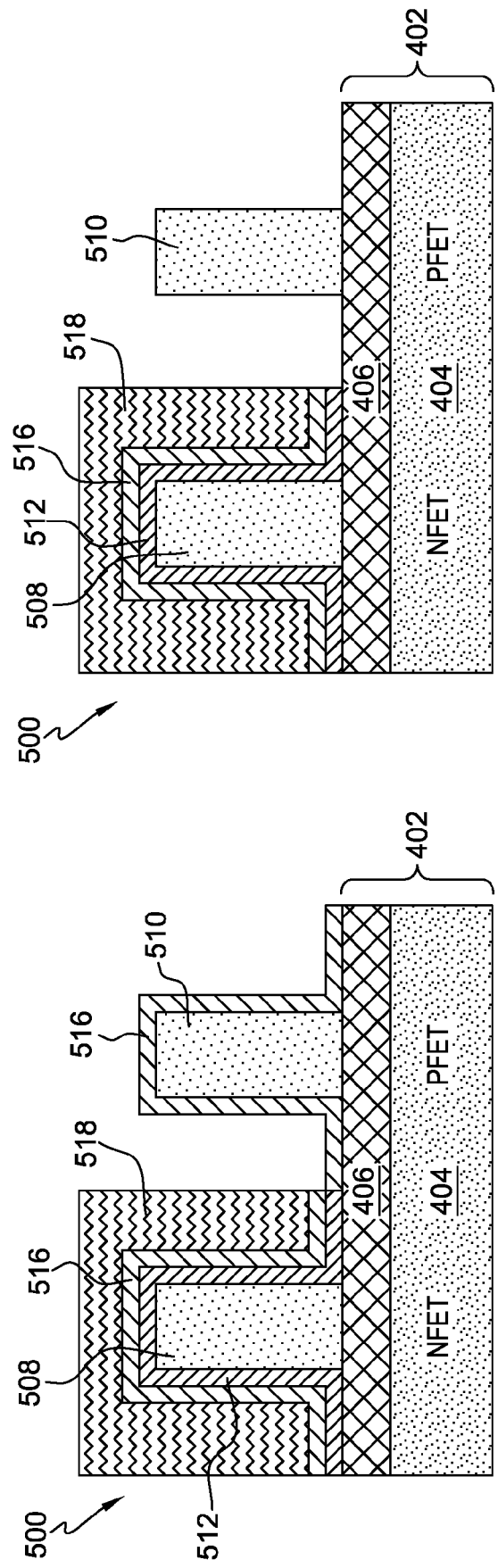

CONFORMAL DOPING FOR FINFET DEVICES

BACKGROUND

The present invention relates to FinFET structures and, more particularly, relates to the formation of fins having conformal doping in a CMOS process flow.

FinFET devices and FinFET structures are nonplanar devices and structures typically built on a semiconductor on insulator (SOI) substrate. The FinFET devices are field effect transistors which may comprise a vertical semiconductor fin, rather than a planar semiconductor surface, having a single or double gate wrapped around the fin. In an effort to provide for continued scaling of semiconductor structures to continuously smaller dimensions while maintaining or enhancing semiconductor device performance, the design and fabrication of semiconductor fin devices and semiconductor fin structures has evolved within the semiconductor fabrication art.

BRIEF SUMMARY

The various advantages and purposes of the exemplary embodiments as described above and hereafter are achieved by providing, according to a first aspect of the exemplary embodiments, a. conformal doping process for FinFET devices including: forming a first plurality of fins on a semiconductor substrate; forming a first plurality of gates with each gate of the first plurality of gates wrapping around a central portion of at least one of the fins of the first plurality of fins so as to leave end portions of the first plurality of fins exposed, the first plurality of fins and first plurality of gates being for N-type FinFET devices (NFETs); forming a second plurality of fins on the semiconductor substrate; forming a second plurality of gates with each gate of the second plurality of gates wrapping around a central portion of at least one of the fins of the second plurality of fins so as to leave end portions of the second plurality of fins exposed, the second plurality of fins and second plurality of gates being for P-type FinFET devices (PFETs); conformally depositing an N-type dopant composition over the NFET first plurality of fins and the PFET second plurality of fins such that the N-type dopant composition is in direct contact with the NFET first plurality of fins and indirectly in contact with the PFET second plurality of fins; annealing the semiconductor substrate to drive in an N-type dopant from the N-type dopant composition into the NFET first plurality fins; stripping the N-type dopant composition from the NFET first plurality of fins and the PFET second plurality of fins; conformally depositing a P-type dopant composition over the NFET first plurality of fins and the PFET second plurality of fins such that the P-type dopant composition is in direct contact with the PFET second plurality of fins and indirectly in contact with the NFET first plurality of fins; annealing the semiconductor substrate to drive in a P-type dopant from the P-type dopant composition into the PFET second plurality fins; and stripping the P-type dopant composition from the NFET first plurality fins and the PFET second plurality of fins.

According to a second aspect of the exemplary embodiments, there is provided a conformal doping process for FinFET devices including: forming a first plurality of fins on a semiconductor substrate; forming a first plurality of gates with each gate of the first plurality of gates wrapping around a central portion of at least one of the fins of the first plurality of fins so as to leave end portions of the first plurality of fins exposed, the first plurality of fins and first plurality of gates being for N-type FinFET devices (NFETs); forming a second plurality of fins on the semiconductor substrate; forming a second plurality of gates with each gate of the second plurality of gates wrapping around a central portion of at least one of the fins of the second plurality of fins so as to leave end portions of the second plurality of fins exposed, the second plurality of fins and second plurality of gates being for P-type FinFET devices (PFETs); conformally depositing AsH3 over the NFET first plurality of fins and the PFET second plurality of fins such that the AsH3 is in direct contact with the NFET first plurality of fins and indirectly in contact with the PFET second plurality of fins; annealing the semiconductor substrate to drive in an As dopant from the AsH3 into the NFET first plurality fins; stripping the $AsH_3$ from the NFET first plurality of fins and the PFET second plurality of fins; conformally depositing $B_2H_6$ over the NFET first plurality of fins and the PFET second plurality of fins such that the $B_2H_6$ is in direct contact with the PFET second plurality of fins and indirectly in contact with the NFET first plurality of fins; annealing the semiconductor substrate to drive in a B dopant from the $B_2H_6$ into the PFET second plurality fins; and stripping the $B_2H_6$ from the NFET first plurality fins and the PFET second plurality of fins.

According to a third aspect of the exemplary embodiments, there is provided a conformal doping process for FinFET devices including: forming a first plurality of fins on a semiconductor substrate; forming a first plurality of gates with each gate of the first plurality of gates wrapping around a central portion of at least one of the fins of the first plurality of fins so as to leave end portions of the first plurality of fins exposed, the first plurality of fins and first plurality of gates being for N-type FinFET devices (NFETs); forming a second plurality of fins on the semiconductor substrate; forming a second plurality of gates with each gate of the second plurality of gates wrapping around a central portion of at least one of the fins of the second plurality of fins so as to leave end portions of the second plurality of fins exposed, the second plurality of fins and second plurality of gates being for P-type FinFET devices (PFETs); conformally depositing a first dopant composition over one of the NFET first plurality of fins and the PFET second plurality of fins; stripping the first dopant composition from the other of the NFET first plurality of fins and the PFET second plurality of fins; conformally depositing a second dopant composition over the NFET first plurality of fins and the PFET second plurality of fins such that the second dopant composition is in direct contact with the other of the NFET first plurality of fins and the PFET second plurality of fins and indirectly in contact with the first dopant composition on the one of the NFET first plurality of fins and the PFET second plurality of fins; annealing the semiconductor substrate to drive in a first dopant from the first dopant composition into the one of the NFET first plurality fins and the PFET second plurality of fins and a second dopant from the second dopant composition into the other of the NFET first plurality of fins and the PFET second plurality of fins; stripping the second dopant composition from the NFET first plurality fins and the PFET second plurality of fins; and stripping the first dopant composition from the one of the NFET first plurality of fins and the PFET second plurality of fins.

BRIEF DESCRIPTION OF SEVERAL VIEWS OF THE DRAWINGS

The features of the exemplary embodiments believed to be novel and the elements characteristic of the exemplary embodiments are set forth with particularity in the appended claims. The Figures are for illustration purposes only and are not drawn to scale. The exemplary embodiments, both as to organization and method of operation, may best be understood by reference to the detailed description which follows taken in conjunction with the accompanying drawings in which:

FIGS. 1A to 1H illustrate a process for forming fins on a semiconductor substrate wherein:

FIG. 1A illustrates a starting structure including a semiconductor on insulator (SOI) substrate, an oxide layer, an amorphous silicon layer and a hard mask layer;

FIG. 1B illustrates the patterning of the amorphous silicon layer and the hard mask layer;

FIG. 1C illustrates the removal of the hard mask layer, leaving only stripes of amorphous silicon;

FIG. 1D illustrates the deposition of a conformal layer of nitride;

FIG. 1E illustrates the etching of the nitride to form sidewall spacers;

FIG. 1F illustrates the etching of the stripes of amorphous silicon to leave only the sidewall spacers;

FIG. 1G illustrates the etching of the oxide layer and the silicon layer of the SOI substrate using the sidewall spacers as a mask to result in stripes of oxide on silicon fins; and FIG. 1H illustrates the etching of the sidewall spacers and the oxide stripes to result in silicon fins.

FIGS. 4A to 4J illustrate a first exemplary process for conformal doping of a FinFET structure wherein FIGS. 4A to 4J are cross-sectional views in the direction of arrows A-A in FIG. 2 and wherein:

FIG. 4A illustrates a semiconductor substrate having an NFET fin representing NFET fins and a PFET fin representing PFET fins covered by an oxide;

FIG. 4B illustrates forming a photoresist to block the PFET fins;

FIG. 4C illustrates removing the oxide from the NFET fins;

FIG. 4D illustrates the deposition of an N-type dopant composition;

FIG. 4E illustrates the driving in of the N-type dopant into the NFET fins and the removal of the remaining N-type dopant composition and the oxide layer;

FIG. 4F illustrates the deposition of another oxide layer;

FIG. 4G illustrates forming a photoresist to block the NFET fins;

FIG. 4H illustrates removing the oxide layer from the PFET fins;

FIG. 4I illustrates the deposition of a P-type dopant composition; and

FIG. 4J illustrates the driving in of the P-type dopant into the PFET fins and the removal of the remaining P-type dopant composition and the oxide layer.

FIGS. 5A to 5H illustrate a second exemplary process for conformal doping of a FinFET structure wherein FIGS. 5A to 5H are cross-sectional views in the direction of arrows A-A in FIG. 2 and wherein:

FIG. 5A illustrates a semiconductor substrate having an NFET fin representing NFET fins and a PFET fin representing PFET fins covered by an N-type dopant composition;

FIG. 5B illustrates forming a photoresist to block the NFET fins;

FIG. 5C illustrates the removal of the N-type dopant composition from the PFET fins;

FIG. 5D illustrates the deposition of an oxide layer;

FIG. 5E illustrates forming a photoresist to block the NFET fins;

FIG. 5F illustrates the removal of the oxide layer from the PFET fins;

FIG. 5G illustrates the deposition of a P-type composition;

FIG. 5H illustrates the driving in of the N-type dopant into the NFET fins, the driving in of the P-type dopant into the PFET fins and the removal of the remaining P-type dopant composition, the oxide layer and the removal of the remaining N-type dopant composition.

DETAILED DESCRIPTION

Referring now to FIGS. 1A to 1H, there is illustrated a preferred process for forming a semiconductor substrate having fins for practicing the exemplary embodiments. The preferred process may be referred to as the sidewall image transfer process.

Figure 1B:
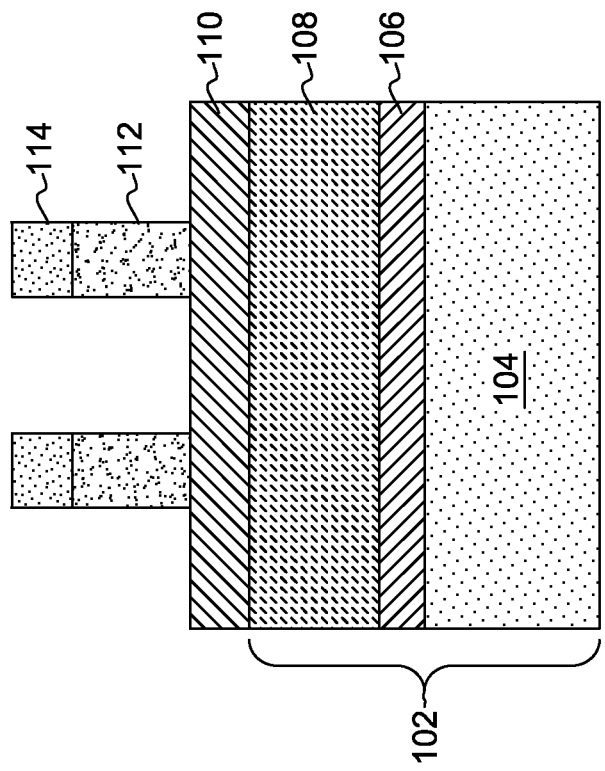
Figure 1A:
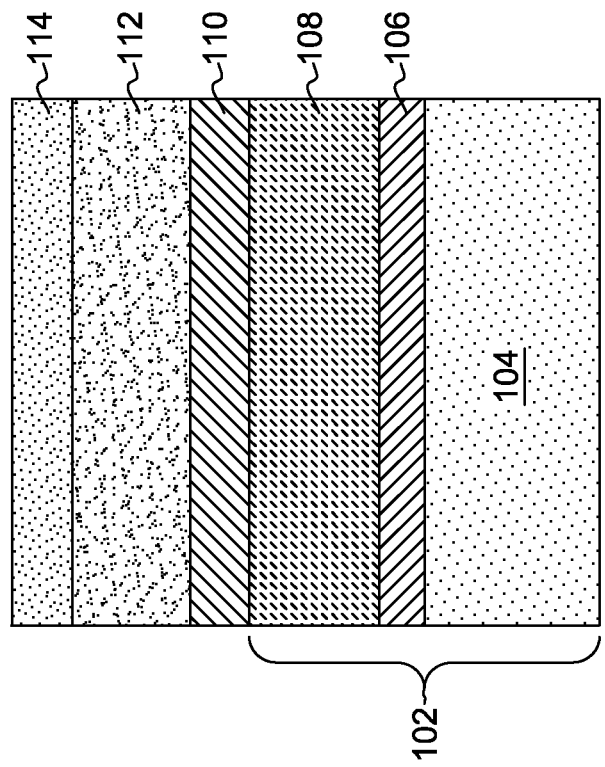

In FIG. 1A, the process begins with a preferred semiconductor on insulator (SOI) substrate 102, also frequently referred to as a silicon on insulator substrate. The SOI substrate 102 may comprise a semiconductor base 104 (usually silicon but may be other semiconductor materials), a dielectric layer 106, usually an oxide layer (may also be called a buried oxide or BOX layer), and a semiconductor material 108, which is usually silicon. For the purposes of the present exemplary embodiments, it is preferred that semiconductor material 108 is silicon and will be referred to as such in the discussion that follows. On top of silicon 108 is an oxide layer 110, followed by an amorphous silicon layer 112 and hard mask layer 114, usually a nitride. Not shown in FIG. 1A are photoresist and other layers which may be used to pattern the hard mask layer 114.

Referring now to FIG. 1B, the hard mask layer 114 has been patterned and etched down through the amorphous silicon layer 112, stopping on the oxide layer 110.

Figure 1D:
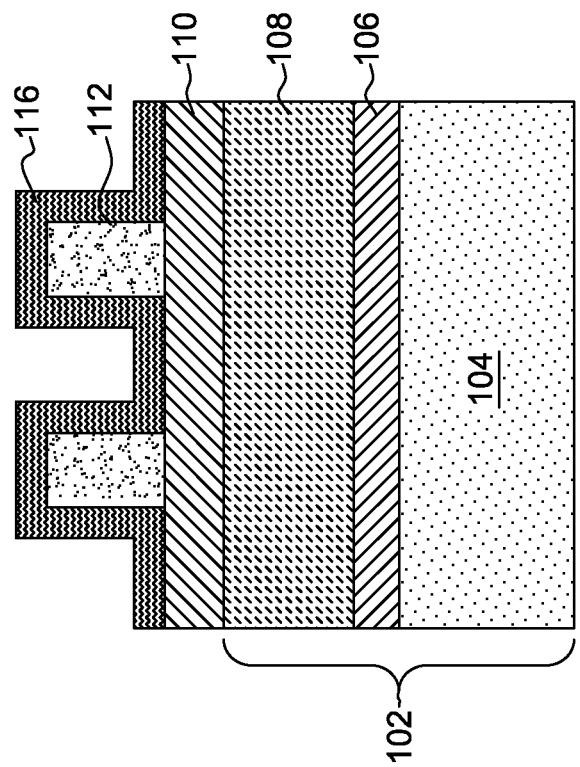
Figure 1C:
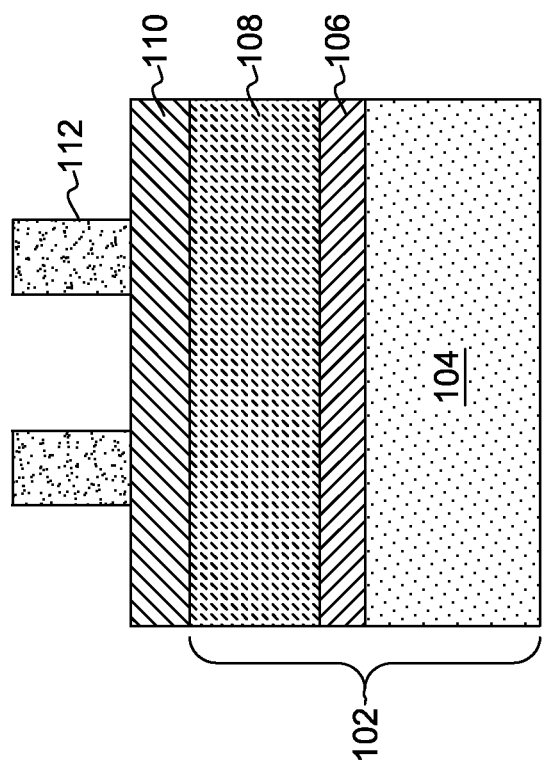

Referring now to FIG. 1C, the hard mask layer 114 has been conventionally stripped, leaving only stripes of amorphous silicon 112. Shown in FIG. 1C are only the ends of the stripes of amorphous silicon 112 which run perpendicular to the page.

Thereafter, a conformal layer of nitride 116 is deposited over the stripes of amorphous silicon 112, as shown in FIG. 1D.

The conformal layer of nitride 116 is conventionally etched to form sidewall spacers 118, as shown in FIG. 1E, followed by conventionally etching the stripes of amorphous silicon 112 to result in only the spacers 118 left on the surface of oxide layer 110, as shown in FIG. 1F.

Figure 1H:
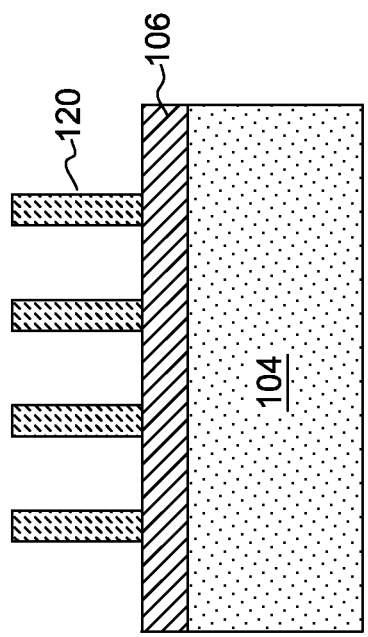
Figure 1G:
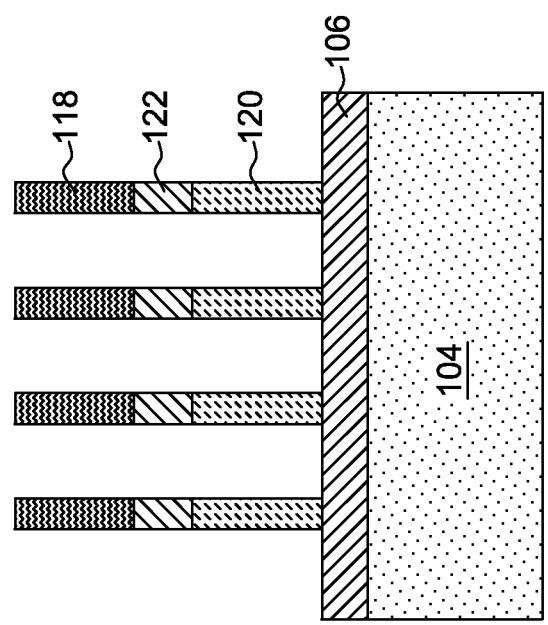

Using the spacers 118 as a mask, the substrate is etched to form fins 120 and stripes of oxide 122 on the fins 120 as shown in FIG. 1G.

Referring now to FIG. 1H, the spacers 118 and stripes of oxide 122 are conventionally etched to result in fins 120 on BOX layer 106.

Figure 2:
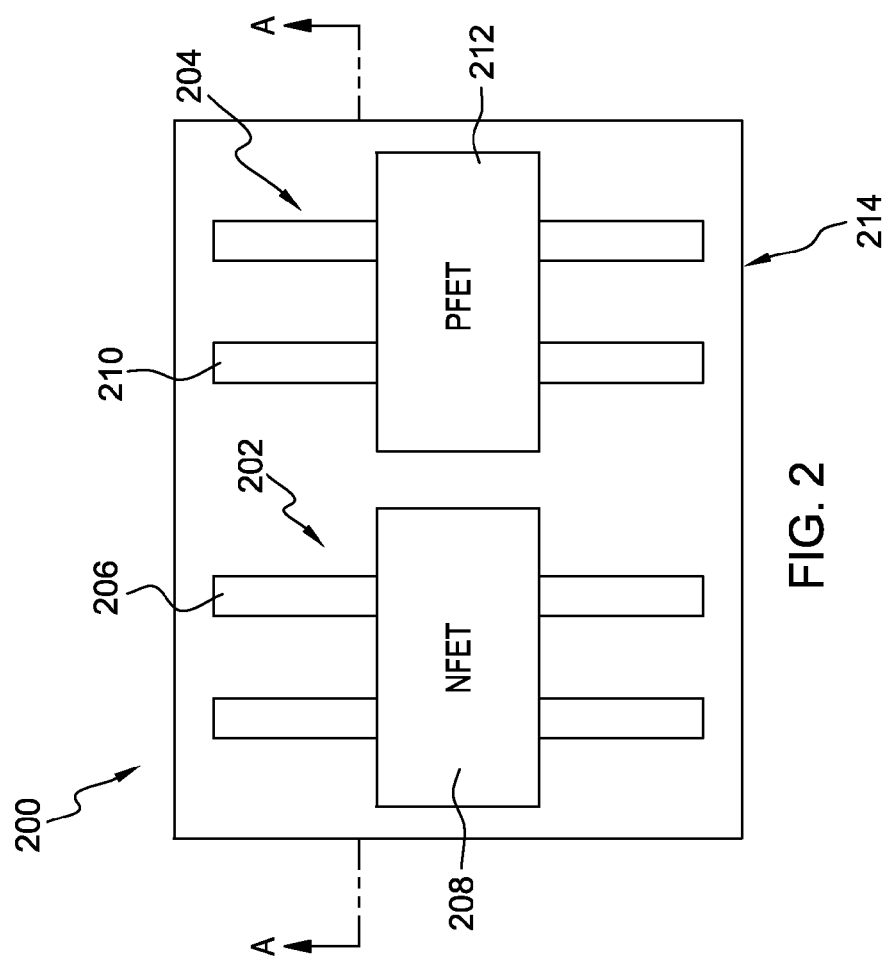
FIG. 2 is a plan view of a FinFET structure comprising a plurality of N-type FinFETs (NFETS) and a plurality of P-type FinFETs (PFETS).

Referring now to FIG. 2, there is illustrated a plan view of a starting FinFET structure 200 comprising a plurality of N-type FinFETs (NFETS) 202 and a plurality of P-type FinFETs (PFETS) 204. Each NFET 202 may comprise at least one fin 206 and a gate 208 wrapped around the fin 206. As shown in FIG. 2, the NFET 202 may comprise a plurality of fins 206 and corresponding gate 208 that wraps around each of the plurality of fins 206. Similarly, each PFET 204 may comprise at least one fin 210 and a gate 212 wrapped around the fin 210. As shown in FIG. 2, the PFET 204 may comprise a plurality of fins 210 and corresponding gate 212 that wraps around each of the plurality of fins 210. The NFET 202 and PFET 204 may be formed on a semiconductor substrate 214. The fins 206, 210 may be formed in a process such as that illustrated in FIGS. 1A to 1H.

Figure 3:
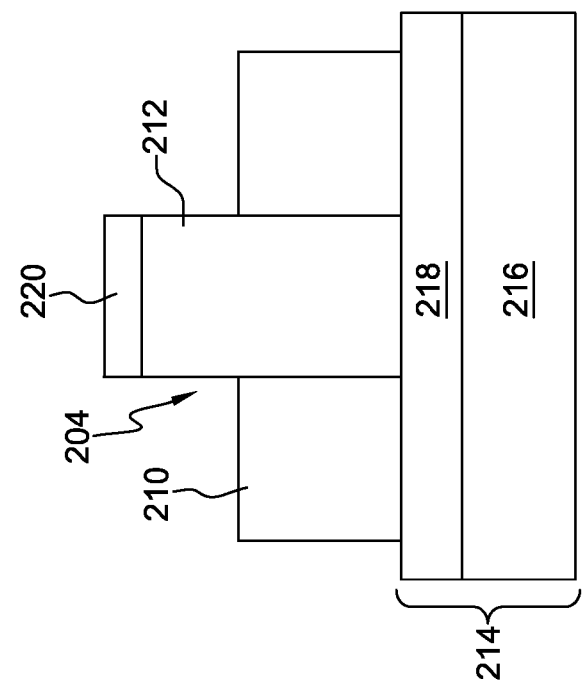
FIG. 3 is a side view of the FinFET structure of FIG. 2 illustrating a fin and a gate.

FIG. 3 is a side view of the FinFET structure 200 of FIG. 2 illustrating the PFET 204 having a fin 210 and a gate 212 on semiconductor substrate 214. The semiconductor substrate 214, for purposes of illustration and not limitation, may comprise an SOI substrate and include a semiconductor base 216 and a BOX layer 218. The gate 212 may typically include a gate dielectric, for example, a high dielectric constant (high-k) material and a gate body, for example, polysilicon. These and other layers which may be present in the gate 212 are not shown for clarity. On top of gate 212 may be a hard mask layer 220 such as silicon nitride.

FIGS. 4A to 4J illustrate a first exemplary process for conformal doping of a FinFET structure 400 wherein FIGS. 4A to 4J are cross-sectional views in the direction of arrows A-A in FIG. 2 except that only one fin for each of the NFET 202 and PFET 204 are shown for clarity. The process for FinFET structure 400 may begin with the FinFET structure 200 of FIGS. 2 and 3. In the following process flow, the ends of the fins 206, 210 (shown in FIG. 2) not covered by the gates 208, 212 (shown in FIG. 2) may be conformally doped.

Figure 4B:
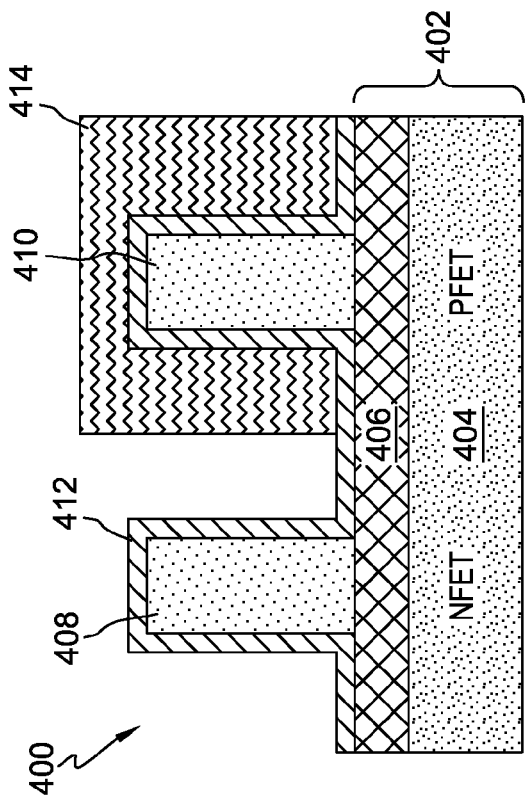
Figure 4A:
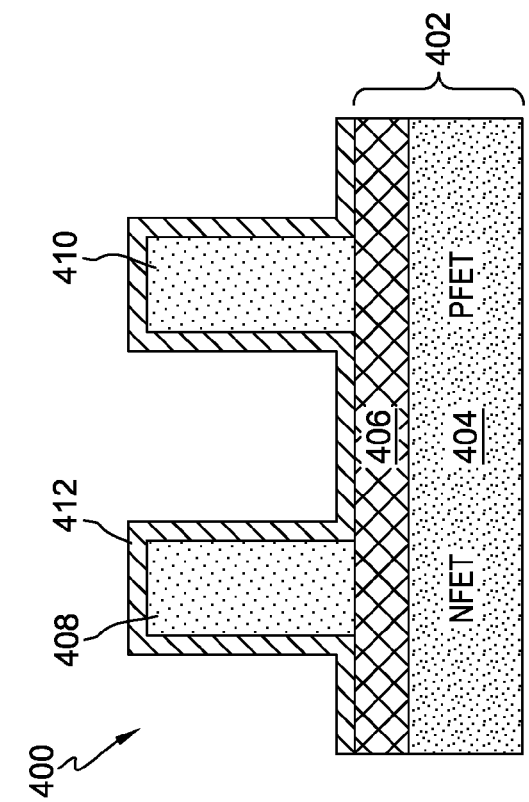

Referring first to FIG. 4A, FinFET structure 400 includes a semiconductor substrate 402, which for purposes of illustration and not limitation may comprise an SOI substrate and may include a semiconductor base 404 and a BOX layer 406. On top of semiconductor substrate 402 are a plurality of fins, some of the fins 408 being for NFET devices and some of the fins 410 being for PFET devices. The fins 408, 410 may be directly in contact with BOX layer 406. An oxide layer 412, for example, silicon oxide may be conformally deposited over the NFET fins 408, the PFET fins 410 and the semiconductor substrate 402. The oxide layer 412 may be conventionally deposited to a thickness of about 3 to 5 nanometers (nm). The gate (not shown for convenience) may be also covered by the oxide layer 412.

Referring now to FIG. 4B, the PFET fins 410 and the gate (not shown) may be blocked with a photoresist 414. In one processing method, the photoresist 414 may be deposited to cover the entire FinFET structure 400 and then through a lithographic process, the photoresist 414 is removed from the NFET fins 408 and a portion of the semiconductor substrate 402 as shown in FIG. 4B.

Figure 4D:
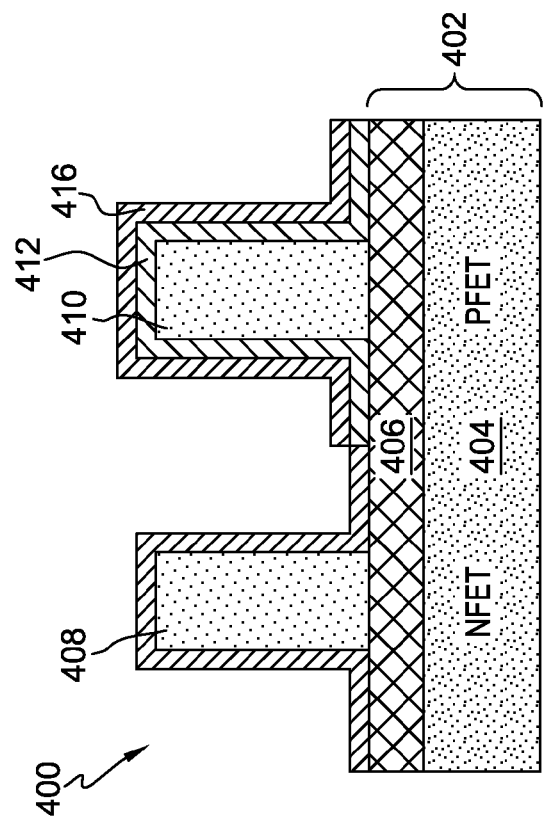
Figure 4C:
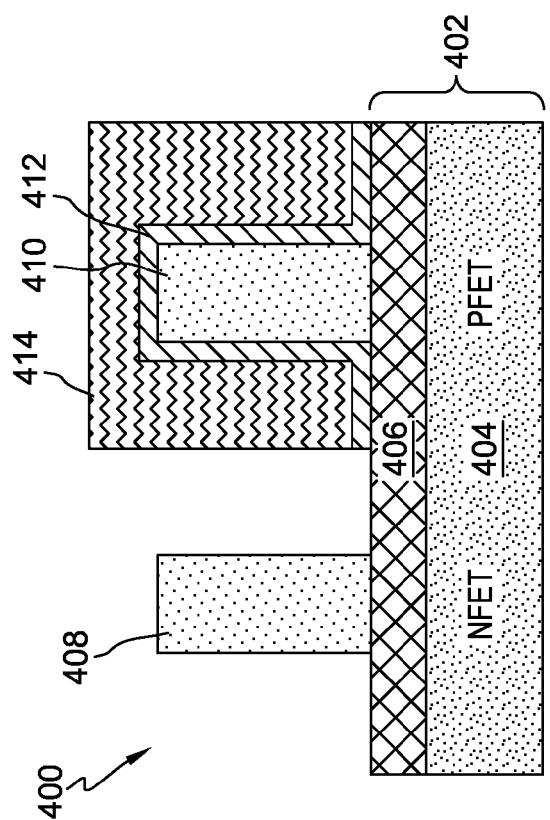

The oxide layer 412 may be stripped from the NFET fins 408 by dilute hydrofluoric acid (HF) as now shown in FIG. 4C. NFET fins 408 no longer have an oxide layer.

The photoresist 414 then may be removed, for example, by conventional oxygen ($O_2$) ashing.

An N-type dopant composition 416 is then deposited on the NFET fins 408, the PFET fins 410 and the semiconductor substrate 402 as shown in FIG. 4D. The N-type dopant composition 416 is preferably deposited by a plasma process to a thickness of about 1 nm. The gate (not shown for convenience) may be also covered by the N-type dopant composition 416.

It is preferred that the N-type dopant composition 416 comprises $AsH_3$ (also known as arsine). Plasma doping is a technique characterized by the implantation of energetic impurity ions that are generated by immersing the substrate into a plasma and applying a negative bias voltage—pulsed bias in general—to the substrate. The system consists of a chamber, an RF power and a high vacuum pumping system, a high voltage pulse supply and gas supply system. The plasma doping source is a gas mixture of $AsH_3$, in the case of the preferred dopant composition, and helium gas. When the substrate is exposed to the plasma, the doping will be either impinging into or deposit onto the surface to achieve very shallow junction formation either in planar or vertical structure. The plasma doping will deposit layers of arsenic dopant on the fins.

The FinFET structure 400 then undergoes an anneal to drive in the N-type dopant, preferably the arsenic from the arsine deposition, into the NFET fins 408. The oxide layer 412 on the PFET fins 410 prevents the doping of the PFET fins 410 by the N-type dopant. The anneal is preferably a rapid thermal anneal at a temperature of about 1000 to 1050° C. for 1 to 2 seconds. After the anneal, the N-type dopant composition 416 may be stripped off the fins 408, 410, gate (not shown) and semiconductor substrate 402 using ammonium peroxide followed by dilute HF to remove the oxide layer 412 from the PFET fins 410.

Figure 4E:
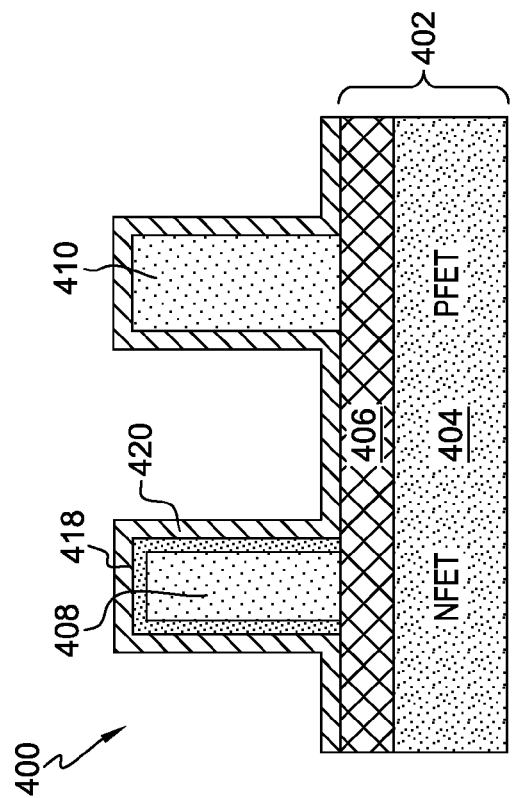

The resulting structure is shown in FIG. 4E. NFET fins 408 now contain an outer conformal layer 418 which contains the dopant (arsenic for example) resulting from the plasma doping process. Although exposed to the dopant, the BOX layer 106 is not doped by the dopant.

Now that the NFET fins 408 have been conformally doped, the PFET fins 410 may now be conformally doped.

Figure 4F:
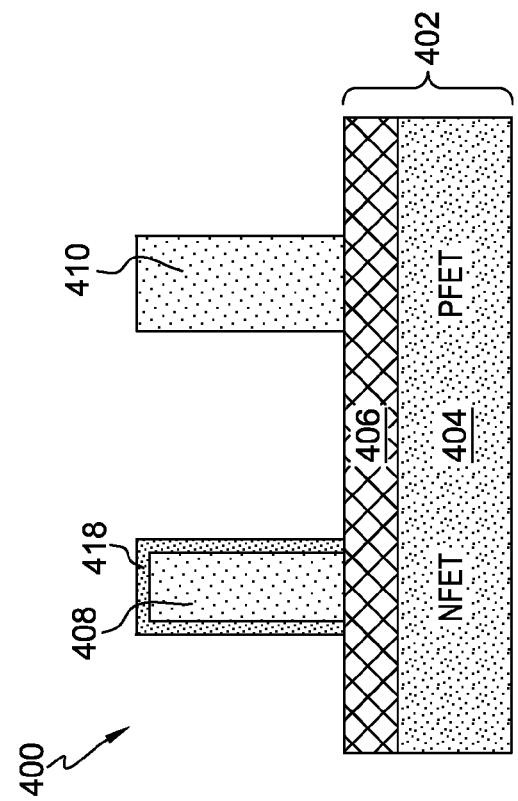

Referring to FIG. 4F, an oxide layer 420, again preferably silicon oxide, is conformally deposited over the NFET fins 408, PFET fins 410 and semiconductor substrate 402. The oxide layer 420 may be conventionally deposited to a thickness of about 3 to 5 nm. The gate (not shown for convenience) may be also covered by the oxide layer 420.

Referring now to FIG. 4G, the NFET fins 408 and the gate (not shown) may be blocked with a photoresist 422. In one processing method, the photoresist 422 is deposited to cover the entire FinFET structure 400 and then through a lithographic process, the photoresist 422 is removed from the PFET fins 410 and a portion of the semiconductor substrate 402 as shown in FIG. 4G.

The oxide layer 420 may be stripped from the PFET fins 410 by dilute HF as now shown in FIG. 4H. PFET fins 410 no longer have an oxide layer.

The photoresist 422 then may be removed, for example, by conventional oxygen ($O_2$) ashing.

Figure 4J:
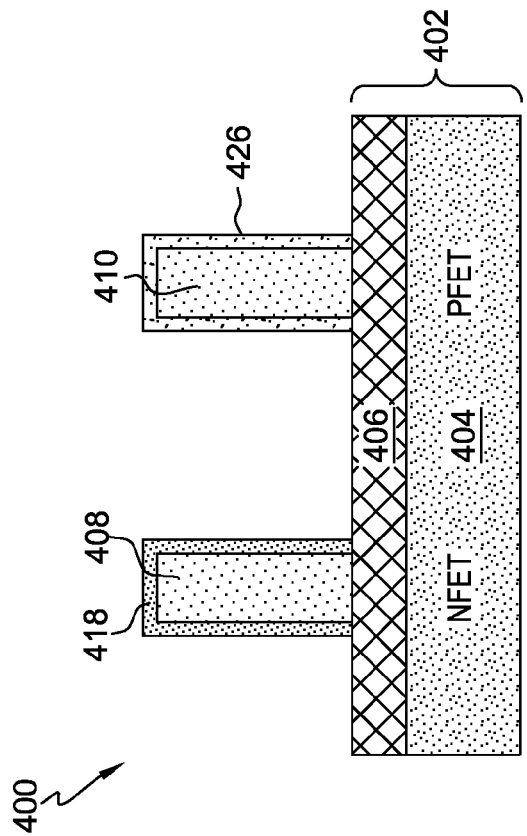
Figure 4I:
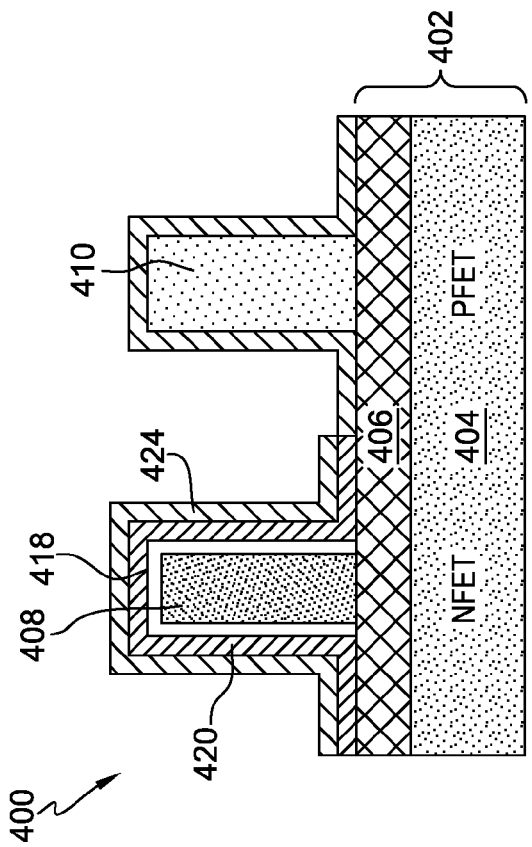

A P-type dopant composition 424 is then deposited on the NFET fins 408, the PFET fins 410 and the semiconductor substrate 402 as shown in FIG. 4I. The P-type dopant composition 424 is preferably deposited by a plasma process to a thickness of about 1 nm. The gate (not shown for convenience) may be also covered by the P-type dopant composition 424.

It is preferred that the P-type dopant composition 424 comprises $B_2H_6$ (also known as diborane). In this plasma doping process, the plasma doping source is a gas mixture of $B_2H_6$, in the case of the preferred dopant composition, and helium gas. When the substrate is exposed to the plasma, the doping will be either impinging into or deposit onto the surface to achieve very shallow junction formation either in planar or vertical structure. The plasma doping will deposit layers of boron dopant.

The FinFET structure 400 then undergoes an anneal to drive in the P-type dopant, preferably the boron from the diborane deposition, into the PFET fins 410. The presence of oxide layer 420 prevents the NFET fins 408 from being doped by the P-type dopant. The anneal is preferably a rapid thermal anneal at a temperature of 1000 to 1050° C. for 1 to 2 seconds. After the anneal, the P-type dopant composition 424 is stripped off the fins 408, 410, gate (not shown) and semiconductor substrate 402 using ammonium peroxide followed by dilute HF to remove the oxide layer 420 from the NFET fins 408.

The resulting structure is shown in FIG. 4J. PFET fins 410 now contain an outer conformal layer 426 which contains the dopant (boron for example) resulting from the plasma doping process. Although exposed to the dopant, the BOX layer 406 is not doped by the dopant.

As a result of this first exemplary process, the NFET fins 408 and PFET fins 410 have both been conformally doped.

It should be understood that while the NFET fins 408 were conformally doped before the PFET fins 410 were doped, the process may be reversed so that the PFET fins 410 are doped first.

FIGS. 5A to 5H illustrate a second exemplary process for conformal doping of a FinFET structure 500 wherein FIGS. 5A to 5H are cross-sectional views in the direction of arrows A-A in FIG. 2 except that only one fin for each of the NFET and PFET are shown for clarity. The process for FinFET structure 500 may begin with the FinFET structure 200 of FIGS. 2 and 3. In the following process flow, the ends of the fins 206, 210 (shown in FIG. 2) not covered by the gates 208, 212 (shown in FIG. 2) may be conformally doped.

Referring first to FIG. 5A, FinFET structure 500 includes a semiconductor substrate, which for purposes of illustration and not limitation may comprise the SOI substrate 402 of FIGS. 4A to 4J and may include a semiconductor base 404 and a BOX layer 406. On top of semiconductor substrate 402 are a plurality of fins, some of the fins 508 being for NFET devices and some of the fins 510 being for PFET devices. The fins 508, 510 may be directly in contact with BOX layer 406.

An N-type dopant composition 512 may be deposited on the NFET fins 508, the PFET fins 510 and the semiconductor substrate 402 as shown in FIG. 5A. The N-type dopant composition 512 is preferably deposited by a plasma process to a thickness of about 1 nm. The gate (not shown for convenience) may be also covered by the N-type dopant composition 512.

It is preferred that the N-type dopant composition 512 comprises $AsH_3$ (arsine). The plasma doping may be performed as described previously with respect to the first exemplary embodiment.

Referring now to FIG. 5B, the NFET fins 508 may be blocked with a photoresist 514. In one processing method, the photoresist 514 is deposited to cover the entire FinFET structure 500 and then through a lithographic process, the photoresist 514 is removed from the PFET fins 510 and a portion of the semiconductor substrate 402 as shown in FIG. 5B. Exposed is the N-type dopant composition 512 on the PFET fins 510 and a portion of the semiconductor substrate 402. The gate (not shown) may also be exposed and covered by the N-type dopant composition 512.

The N-type dopant composition 512 may be removed from the exposed areas not covered by the photoresist 514. That is, the N-type dopant composition 512 may be removed from the PFET fins 510 and a portion of the semiconductor substrate 402. The N-type dopant composition 512 may also be removed from the gate (not shown). The resulting structure is shown in FIG. 5C.

The photoresist 514 then may be removed, for example, by conventional $O_2$ ashing.

An oxide layer 516, for example, silicon oxide may be conformally deposited over the NFET fins 508, the PFET fins 510 and the semiconductor substrate 402 as shown in FIG. 5D. In the case of the NFET fins 508, the oxide layer 516 will actually be deposited over the previous N-type dopant composition 512. The oxide layer 516 may be conventionally deposited to a thickness of about 3 to 5 nanometers (nm). The gate (not shown for convenience) may be also covered by the oxide layer 516.

Referring now to FIG. 5E, the NFET fins 508 and the gate (not shown) may be blocked with a photoresist 518. In one processing method, the photoresist 518 is deposited to cover the entire FinFET structure 500 and then through a lithographic process, the photoresist 518 is removed from the PFET fins 510 and a portion of the semiconductor substrate 402 as shown in FIG. 5E.

The oxide layer 516 may be stripped from the PFET fins 510 by dilute HF as now shown in FIG. 5F. PFET fins 510 no longer have an oxide layer.

The photoresist 518 then may be removed, for example, by conventional oxygen ($O_2$) ashing.

Figure 5H:
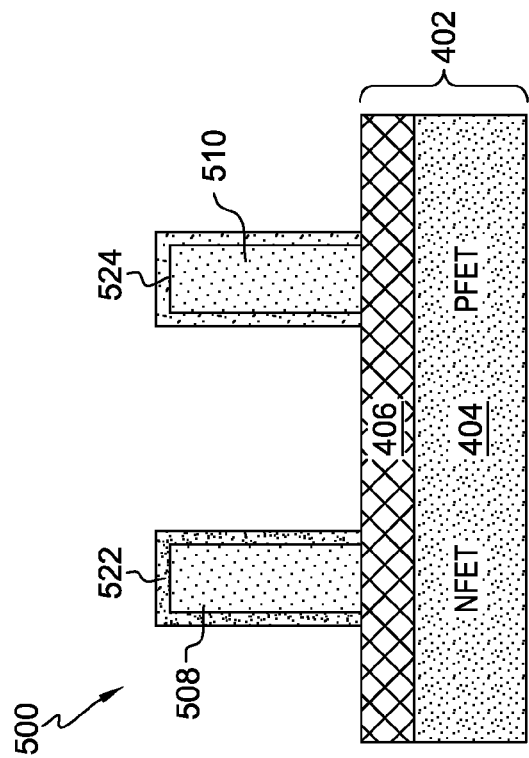
Figure 5G:
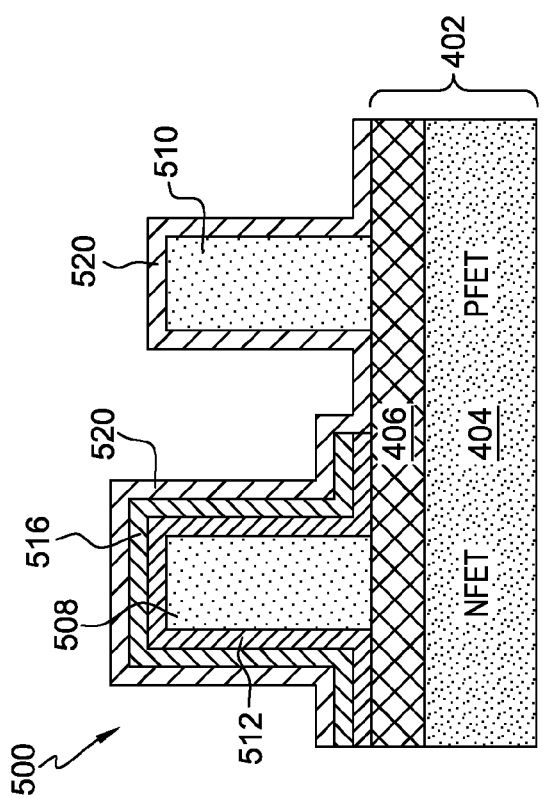

A P-type dopant composition 520 is then deposited on the NFET fins 508, the PFET fins 510 and the semiconductor substrate 402 as shown in FIG. 5G. The P-type dopant composition 520 is preferably deposited by a plasma process to a thickness of about 1 nm. The gate (not shown for convenience) may be also covered by the P-type dopant composition 520. It is noted that with respect to the NFET fins 508, the P-type dopant composition 520 does not actually contact the NFET fins 508 but is insulated therefrom by the N-type dopant composition 512 and the oxide layer 516. Nor does the P-type dopant composition 520 directly contact the gate (not shown) as the gate is protected by the oxide layer 516.

It is preferred that the P-type dopant composition 520 comprises $B_2H_6$ (diborane). The plasma doping process for the P-type dopant composition 520 is preferably as described earlier with respect to the first exemplary embodiment.

The FinFET structure 500 then undergoes an anneal to drive in the N-type dopant, preferably the arsenic from the arsine deposition, into the NFET fins 508 and the P-type dopant, preferably the boron from the diborane deposition, into the PFET fins 510. The anneal is preferably a rapid thermal anneal at a temperature of about 1000 to 1050° C. for 1 to 2 seconds. After the anneal, the P-type dopant composition 520 is stripped off the fins 508, 510, gate (not shown) and semiconductor substrate 402 using ammonium peroxide followed by dilute HF to remove the oxide layer 516 from the NFET fins 508 and the gate (not shown). Lastly, the N-type dopant composition 512 is stripped off the NFET fins 508 using ammonium peroxide.

The resulting structure is shown in FIG. 5H. NFET fins 508 now contain an outer conformal layer 522 which contains the N-type dopant (arsenic for example) resulting from the plasma doping process. Further, PFET fins 510 now contain an outer conformal layer 524 which contains the P-type dopant (boron for example) resulting from the plasma doping process.

As a result of this second exemplary process, the NFET fins 508 and PFET fins 510 have both been conformally doped.

It should be understood that while the N-type dopant composition was deposited first followed by the deposition of the P-type dopant composition, the process may be reversed so that the P-type dopant composition is deposited first followed by a protective oxide layer and then the N-type dopant composition. In this way, the FinFET structure may be annealed once to drive in the dopants in the NFET fins 508 and PFET fins 510 at the same time and conformally dope the NFET fins 508 and PFET fins 510.

After the NFET fins 408, 508 and the PFET fins 410, 510 have been conformally doped as described in the exemplary embodiments, the FinFET structures 400, 500 may undergo further processing to complete the FinFET structures 400, 500 including forming the sources/drains.

It will be apparent to those skilled in the art having regard to this disclosure that other modifications of the exemplary embodiments beyond those embodiments specifically described here may be made without departing from the spirit of the invention. Accordingly, such modifications are considered within the scope of the invention as limited solely by the appended claims.

What is claimed is:

1. A conformal doping process for FinFET devices comprising:
   forming a first plurality of fins on a semiconductor substrate;
   forming a first plurality of gates with each gate of the first plurality of gates wrapping around a central portion of at least one of the fins of the first plurality of fins so as to leave end portions of the first plurality of fins exposed, the first plurality of fins and first plurality of gates being for N-type FinFET devices (NFETs);
   forming a second plurality of fins on the semiconductor substrate;
   forming a second plurality of gates with each gate of the second plurality of gates wrapping around a central portion of at least one of the fins of the second plurality of fins so as to leave end portions of the second plurality of fins exposed, the second plurality of fins and second plurality of gates being for P-type FinFET devices (PFETs);
   conformally depositing a first dopant composition over the NFET first plurality of fins, the NFET first plurality of gates, the PFET second plurality of fins and the PFET second plurality of gates;
   stripping the first dopant composition from the PFET second plurality of fins and the PFET second plurality of gates;
   forming a conformal oxide layer over the NFET first plurality of fins, the NFET first plurality of gates, the PFET second plurality of fins and the PFET second plurality of gates;
   stripping the conformal oxide layer from the PFET second plurality of fins and the PFET second plurality of gates;
   conformally depositing a second dopant composition over the NFET first plurality of fins, the NFET first plurality of gates, the PFET second plurality of fins and the PFET second plurality of gates such that the second dopant composition is in direct contact with the PFET second plurality of fins and the PFET second plurality of gates and indirectly in contact with the first dopant composition on the NFET first plurality of fins and the NFET first plurality of gates;
   annealing the semiconductor substrate to drive in a first dopant from the first dopant composition into the NFET first plurality fins and a second dopant from the second dopant composition into the PFET second plurality of fins;
   stripping the second dopant composition from the NFET first plurality fins, the NFET first plurality of gates, the PFET second plurality of fins and the PFET second plurality of gates;
   stripping the conformal oxide layer from the NFET first plurality of fins and the NFET first plurality of gates; and
   stripping the first dopant composition from the NFET first plurality of fins and the NFET first plurality of gates.

2. The conformal doping process of claim 1 wherein the first dopant composition is $AsH_3$ and the second dopant composition is $B_2H_6$.

3. The conformal doping process of claim 1 wherein the semiconductor substrate is a semiconductor on insulator (SOI) substrate.

4. A conformal doping process for FinFET devices comprising:
   forming a first plurality of fins on a semiconductor substrate;
   forming a first plurality of gates with each gate of the first plurality of gates wrapping around a central portion of at least one of the fins of the first plurality of fins so as to leave end portions of the first plurality of fins exposed, the first plurality of fins and first plurality of gates being for N-type FinFET devices (NFETs);
   forming a second plurality of fins on the semiconductor substrate;
   forming a second plurality of gates with each gate of the second plurality of gates wrapping around a central portion of at least one of the fins of the second plurality of fins so as to leave end portions of the second plurality of fins exposed, the second plurality of fins and second plurality of gates being for P-type FinFET devices (PFETs);
   conformally depositing a first dopant composition over the NFET first plurality of fins, the NFET first plurality of gates, and the PFET second plurality of fins and the PFET second plurality of gates;
   stripping the first dopant composition from the NFET first plurality of fins and the NFET first plurality of gates;
   forming a conformal oxide layer over the NFET first plurality of fins, the NFET first plurality of gates, the PFET second plurality of fins and the PFET second plurality of gates;
   stripping the conformal oxide layer from the NFET first plurality of fins and the NFET first plurality of gates;
   conformally depositing a second dopant composition over the NFET first plurality of fins, the NFET first plurality of gates, and the PFET second plurality of fins and the PFET second plurality of gates such that the second dopant composition is in direct contact with the NFET first plurality of fins and the NFET first plurality of gates and indirectly in contact with the first dopant composition on the PFET second plurality of fins and the PFET second plurality of gates;
   annealing the semiconductor substrate to drive in a first dopant from the first dopant composition into the PFET second plurality fins and a second dopant from the second dopant composition into the NFET first plurality of fins;
   stripping the second dopant composition from the NFET first plurality fins, the NFET first plurality of gates, and the PFET second plurality of fins and the PFET second plurality of gates; and
   stripping the conformal oxide layer from the PFET second plurality of fins and the PFET second plurality of gates; and
   stripping the first dopant composition from the PFET second plurality of fins and the PFET second plurality of gates.

5. The conformal doping process of claim 4 wherein the first dopant composition is $B_2H_6$ and the second dopant composition is $AsH_3$.

6. The conformal doping process of claim 4 wherein the semiconductor substrate is a semiconductor on insulator (SOI) substrate.

* * * * *